US009222985B2

(12) United States Patent
Kang et al.

(10) Patent No.: US 9,222,985 B2
(45) Date of Patent: Dec. 29, 2015

(54) APPARATUS AND METHOD FOR MANAGING BATTERY SYSTEM

(71) Applicant: LG CHEM, LTD., Seoul (KR)

(72) Inventors: Jung-Soo Kang, Daejeon (KR); Jong-Mo Jung, Daejeon (KR)

(73) Assignee: LG Chem, Ltd., Seoul (KR)

( * ) Notice: Subject to any disclaimer, the term of this patent is extended or adjusted under 35 U.S.C. 154(b) by 26 days.

(21) Appl. No.: 13/901,619

(22) Filed: May 24, 2013

(65) Prior Publication Data
US 2013/0249317 A1 Sep. 26, 2013

Related U.S. Application Data

(63) Continuation of application No. PCT/KR2011/010145, filed on Dec. 27, 2011.

(30) Foreign Application Priority Data

Dec. 28, 2010 (KR) ........................ 10-2010-0136350
Dec. 27, 2011 (KR) ........................ 10-2011-0142967

(51) Int. Cl.
G01R 31/36 (2006.01)
H01M 10/42 (2006.01)
(Continued)

(52) U.S. Cl.
CPC ........ *G01R 31/3606* (2013.01); *G01R 31/3658* (2013.01); *H01M 10/425* (2013.01);
(Continued)

(58) Field of Classification Search
CPC ........... G01R 31/3606; G01R 31/3658; G01R 31/3679; H01M 10/4207; H01M 10/425; H01M 10/482; H01M 2010/4271; H02J 7/0026

USPC .......... 307/116; 324/433; 320/134, 118, 126, 320/119

See application file for complete search history.

(56) References Cited

U.S. PATENT DOCUMENTS 5,422,558 A 6/1995 Stewart
6,046,514 A 4/2000 Rouillard et al.
(Continued)

FOREIGN PATENT DOCUMENTS

JP 6-283210 A 10/1994
JP 2008-288109 A 11/2008
(Continued)

OTHER PUBLICATIONS

International Search Report issued in PCT/KR2011/010145, mailed on Jun. 27, 2012.
(Continued)

*Primary Examiner* — Rexford Barnie
*Assistant Examiner* — Elim Ortiz
(74) *Attorney, Agent, or Firm* — Birch, Stewart, Kolasch & Birch, LLP

(57) ABSTRACT

In accordance with one aspect of the present invention, provided is an apparatus for managing a battery system having a plurality of battery cells connected in series, the apparatus comprising a performance measurement section for measuring a performance of each of the battery cells; a cell switching section for turning on or off a connection of each battery cell to other battery cells; and a controlling section for comparing the performance of each battery cell measured by the performance measurement section with a reference performance and, in the presence of the battery cell(s) having measured performance lower than the reference performance, controlling the cell switching section to interrupt the connection of the relevant battery cell(s) to other battery cells.

7 Claims, 8 Drawing Sheets

(51) Int. Cl.
*H01M 10/48* (2006.01)
*H02J 7/00* (2006.01)

(52) U.S. Cl.
CPC ........ *H01M10/4207* (2013.01); *H01M 10/482* (2013.01); *G01R 31/3679* (2013.01); *H01M 2010/4271* (2013.01); *H02J 7/0024* (2013.01); *H02J 7/0026* (2013.01); *Y10T 307/766* (2015.04)

(56) References Cited

U.S. PATENT DOCUMENTS

| | | | |
|---|---|---|---|
| 6,127,806 A * | 10/2000 | Tanjo | G01R 31/3675 320/132 |
| 6,252,376 B1 | 6/2001 | Nakamura et al. | |
| 6,268,710 B1 * | 7/2001 | Koga | G01R 31/3624 320/116 |
| 7,573,238 B2 * | 8/2009 | Kawai | B60L 3/0046 320/132 |
| 8,183,833 B2 * | 5/2012 | Kobayashi | H02J 7/0014 320/117 |
| 2002/0070707 A1 * | 6/2002 | Sato | H01M 10/425 320/134 |
| 2007/0188138 A1 * | 8/2007 | Kobayashi | H02J 7/0014 320/119 |
| 2009/0128158 A1 * | 5/2009 | Kawai | B60L 3/0046 324/433 |
| 2009/0230922 A1 * | 9/2009 | Elder | B60L 3/0046 320/126 |
| 2010/0085009 A1 * | 4/2010 | Kang | H01M 10/482 320/118 |
| 2012/0013304 A1 | 1/2012 | Murase et al. | |

FOREIGN PATENT DOCUMENTS

| | | |
|---|---|---|
| JP | 2010-232104 A | 10/2010 |
| JP | 2010-273427 A | 12/2010 |
| KR | 1996-0039478 A | 11/1996 |
| KR | 2000-0072984 A | 12/2000 |
| KR | 20-0211543 Y1 | 1/2001 |
| KR | 20-0355122 Y1 | 7/2004 |
| KR | 10-2007-0076833 A | 7/2007 |
| WO | WO 2009/128079 A1 | 10/2009 |

OTHER PUBLICATIONS

Written Opinion of the International Searching Authority issued in PCT/KR2011/010145, mailed on Jun. 27, 2012.

* cited by examiner

APPARATUS AND METHOD FOR MANAGING BATTERY SYSTEM

CROSS-REFERENCE TO RELATED APPLICATION

This application is a continuation of International Application No. PCT/KR2011/010145 filed on Dec. 27, 2011, which claims priority to Korean Patent Application Nos. 10-2010-0136350 and 10-2011-0142967 filed in the Republic of Korea on Dec. 28, 2010 and Dec. 27, 2011, respectively, the entire contents disclosed in the specification and drawings of which are incorporated herein by reference.

TECHNICAL FIELD

The present invention relates to a technology for managing a battery system, and more particularly, to an apparatus and method for managing the battery system including a plurality of battery cells connected in series in the presence of a battery cell or battery cell with performance degradation.

BACKGROUND ART

In today's society, batteries are widely used in various devices including portable electronic products such as notebooks, cameras, cellular phones, MP3 or the like, as well as cars, robots, satellites or the like. The batteries can be classified into primary and secondary batteries and among these, secondary batteries are extensively used due to their great advantages of being able to repeatedly charged/discharged and store energy.

Currently, nickel-cadmium batteries, nickel-hydrogen batteries, nickel-zinc batteries, lithium secondary batteries or the like are commercially available as secondary batteries. Among these, lithium secondary batteries are at the center of interest because they hardly have memory effects and can be freely charged or discharged in comparison with nickel-based secondary batteries. Advantageously, the lithium secondary batteries also exhibit very low self-discharge rate and high energy density.

Such secondary batteries may be used in the form of one battery cell or multiple battery cells connected in series in a battery system. However, the latter case makes it possible to output and store even higher power. In particular, with the gradual exhaustion of carbon energies and the increased interest in the environment recently, the use of a battery system using a secondary battery in large-sized equipments is increasing. Since the battery system used in large-sized equipments requires high output, multiple battery cells connected in series are used.

Exemplary large-sized battery system having multiple battery cells connected in series may include a smart grid system.

The smart grid system is an intelligent electric grid system which incorporates an information and communication technology into the production, transfer and consumption process of power, thereby inducing the interaction of power supply and consumption and thus enhancing the efficiency of electricity usage. The amount of electric energy used by a consumer may not always be constant and can frequently change. For example, in the summer time, the electric energy consumption can increase rapidly due to the use of an air conditioner in the afternoon and rapidly decrease later on in the evening. Like above, the amount of electric energy consumed may not always be constant and can frequently change, and even if the power supply is controlled to some degree, it is realistically impossible to meet the varying electric energy consumption amount. Accordingly, the imbalance of the power supply and electric energy consumption may cause an excess or deficiency of the power supply. In order to solve such a problem, a smart grid system checks for the power status in real time to flexibly control the power supply. A battery system for storing power is an important component in constructing such a smart grid system. Such a battery system for storing power has much more battery cells connected in series than those of a battery system used in typical electronic devices or portable electronic products.

A battery system using multiple battery cells connected in series is useful not only in a smart grid system, but also in a micro grid system and other various fields such as an electric vehicle charging station for supplying power. Moreover, although not as much as the smart grid system, micro grid system, and electric vehicle charging station, the battery system using multiple battery cells connected in series is useful in a battery pack for hybrid or electric vehicles requiring high power output so as to obtain the driving force of vehicles.

However, the battery system using multiple battery cells connected in series may be subject to performance degradation in some battery cells. That is, a situation can occur where some of the battery cells included in the battery system may not operate normally even though most of the battery cells therein are operating normally. Conventionally, although most of the battery cells are still useful, such a performance degradation of some of the battery cells may deteriorate the overall performance of the battery system which may interrupt the use of the battery system itself. Also, in some cases, in spite of the presence of multiple battery cells operating normally, the battery system itself may be exchanged due to its characteristics that the battery cells are connected in series, which may waste unnecessary time and costs.

DISCLOSURE

Technical Problem

The present invention is designed to solve the problems mentioned above, and therefore, it is an aspect of the present invention to provide an apparatus and method for managing a battery system including a plurality of battery cells connected in series, wherein in the case that some battery cells are subject to performance degradation, only the use of relevant battery cells is stopped and the remaining battery cells operating normally are continuously used.

Additional aspects and advantages will be apparent from the embodiments of the present invention. The aspects and advantages of the invention may be realized by means of instrumentalities and combinations particularly pointed out in the appended claims.

Technical Solution

In order to accomplish the above object, the present invention provides an apparatus for managing a battery system having a plurality of battery cells connected in series, the apparatus including a performance measurement section for measuring a performance of each of the battery cells; a cell switching section for turning on or off a connection of each battery cell to other battery cells; and a controlling section for comparing the performance of each battery cell measured by the performance measurement section with a reference performance and, in the presence of the battery cell(s) having measured performance lower than the reference performance, controlling the cell switching section to interrupt the connection of the relevant battery cell(s) to other battery cells. Preferably, the performance of the battery cells is at least one of the voltage, current, resistance and capacity thereof.

Also, the cell switching section is preferably in the form of a 3-contacts switch.

In addition, in order to accomplish the above object, the present invention provides a method for managing a battery system having a plurality of battery cells connected in series, the method including measuring a performance of each of the battery cells; comparing measured performance of each battery cell with a reference performance; and interrupting the connection of the relevant battery cell(s) to other battery cells in the presence of the battery cell(s) having measured performance lower than the reference performance.

Preferably, the performance of battery cells is at least one of the voltage, current, resistance and capacity thereof.

Also, the connection interruption of the battery cells is conducted by using a 3-contacts switch.

Further, in order to accomplish the above object, the present invention provides an apparatus for managing a battery system having a plurality of battery cells connected in series, the apparatus including a performance measurement section for measuring a performance of each of the battery cells; a cell switching section for turning on or off the connection of each battery cell to other battery cells; and a controlling section for comparing the performance of each battery cell measured by the performance measurement section with a reference performance and, in the presence of the battery cell(s) having measured performance lower than a reference performance, controlling the cell switching section to interrupt the connection of the relevant battery cell(s) to other battery cells.

Preferably, the performance of the battery cells is at least one of the voltage, current, resistance and capacity thereof.

Also, the cell switching section is preferably in the form of a 3-contacts switch.

Advantageous Effects

In accordance with an aspect of the present invention, when a battery system including a plurality of battery cells connected in series has some battery cells subject to performance degradation, the overall current path of the battery system is by-passed against the performance degraded battery cell(s) such that the battery system can be continuously used.

Accordingly, even if there is a problem with some of the battery cells among the plurality of battery cells, most of the battery cells operating normally can be continuously used. Therefore, it is possible to prevent most of the battery cells operating normally from being exchanged due to the problem occurring in some of the battery cells, thereby reducing unnecessary time and costs wasted.

In addition, since it is possible to prevent the use of the whole battery system from being interrupted due to the performance degradation of some of the battery cells, any inconvenience to a user or consumer using the battery system can also be prevented.

Furthermore, in accordance with one embodiment of the present invention, when the number of the performance-degraded battery cell(s) exceeds a certain number, a warning information may be provided to a user as well as the information on the location, performance and number of the performance-degraded battery cell(s). Therefore, a user can take suitable action for the maintenance, repair and exchange of the battery pack on the basis of such information.

Also, in accordance with another aspect of the present invention, when a battery system including a plurality of battery cells connected in series has some battery cells subject to performance degradation, the overall current path of the battery system is by-passed against the performance-degraded battery cell(s) such that the battery system can be moderately and continuously used.

DESCRIPTION OF THE DRAWINGS

The accompanying drawings illustrate preferred embodiments of the present disclosure and, together with the foregoing disclosure, serve to provide further understanding of the technical spirit of the present disclosure. However, the present disclosure is not to be construed as being limited to the drawings.

BEST MODE

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
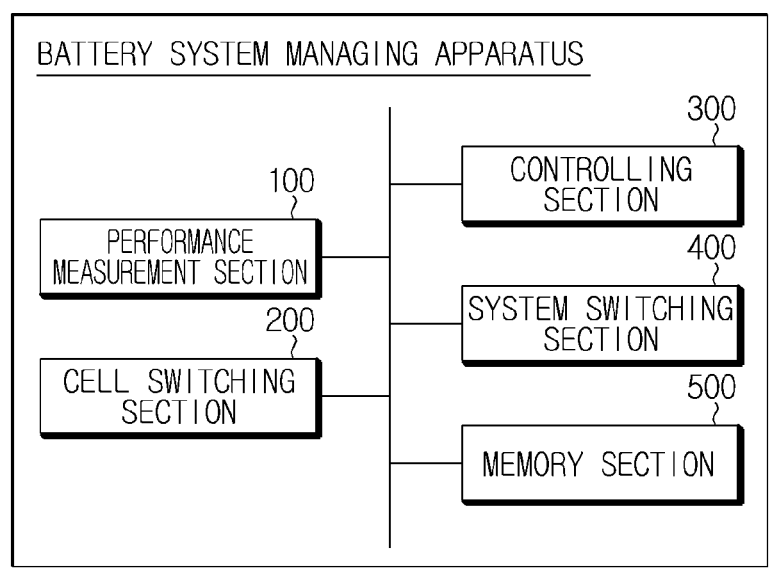
FIG. 1 is a block diagram schematically showing a functional configuration of an apparatus for managing a battery system according to one preferred-embodiment of the present invention.
Figure 2:
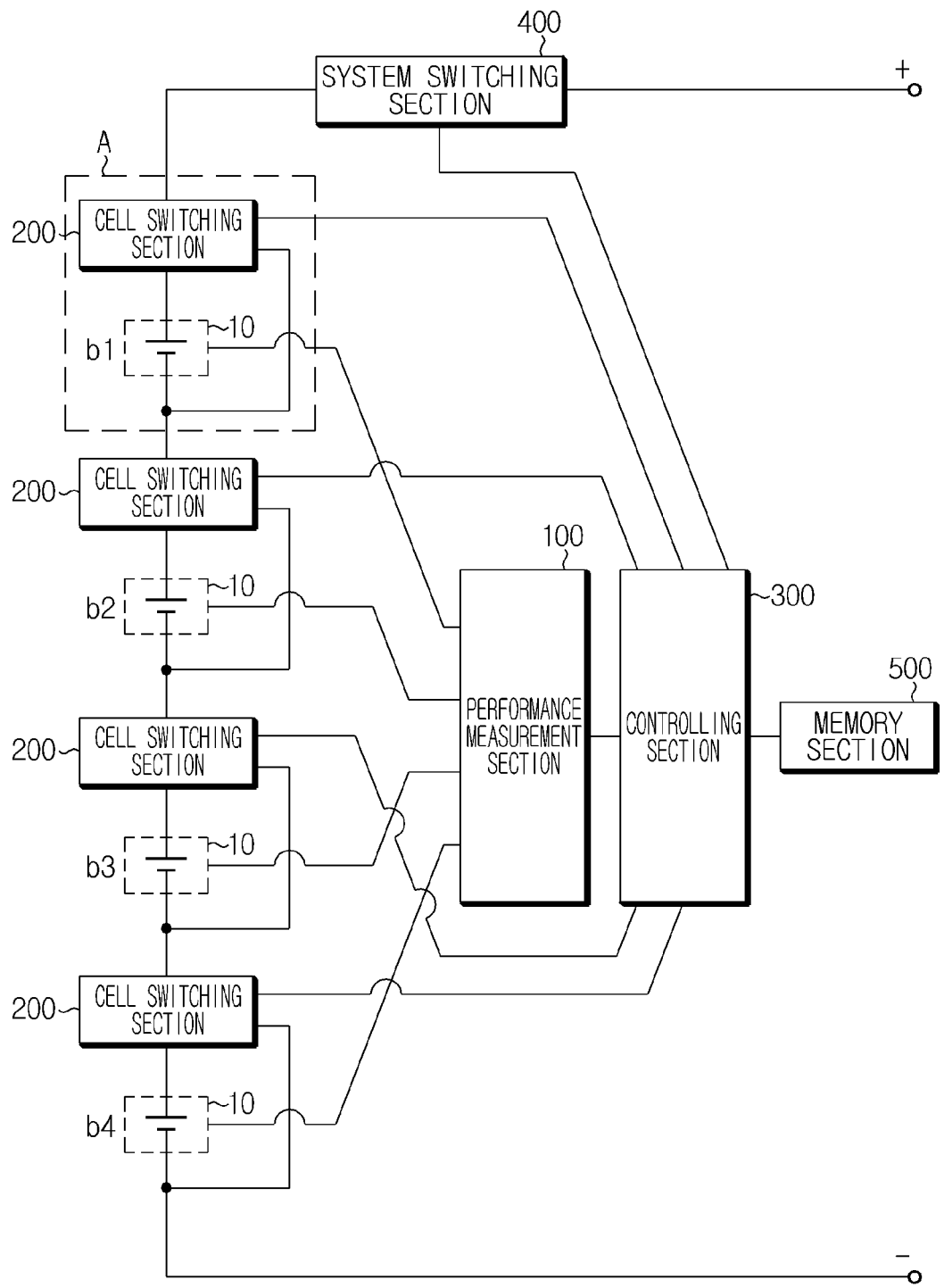
FIG. 2 schematically shows a configuration of an apparatus for managing a battery system according to one embodiment of the present invention, which is connected in a battery system.

FIG. 1 is a block diagram schematically showing a functional configuration of an apparatus for managing a battery system according to one preferred-embodiment of the present invention. FIG. 2 schematically shows a configuration of an apparatus for managing a battery system according to one embodiment of the present invention, which is connected in a battery system.

Referring to FIGS. 1 and 2, the apparatus for managing a battery system according to the present invention includes a performance measurement section 100, a cell switching section 200 and a controlling section 300. Such a battery system managing apparatus may be applied in a battery system including a plurality of battery cells 10 connected in series. FIG. 2 shows, for the convenience of explanation, only four battery cells b1 to b4. However, the present invention is not limited to the specific number of the battery cells 10. Particularly, the present invention is preferably applied in a battery system including dozens to hundreds of many battery cells, such as a battery system for storing the power of a smart grid system.

The performance measurement section 100 measures a performance of each of the battery cells included in the battery system, the battery cells connected in series. Here, the performance of the battery cells 10 means information of battery properties on whether the battery cells 10 may operate normally in a battery system.

Preferably, the performance of the battery cells 10 represents at least one of the voltage, current, resistance and capacity thereof. Accordingly, the performance measurement section 100 may measure a voltage, current, resistance or capacity for each battery cell 10. Also, the performance measurement section 100 may measure at least two among the above properties. This is because a voltage, current, resistance or capacity for a battery cell 10 becomes a good factor in determining the performance of the battery cell 10. If the voltage, current, resistance or capacity of the battery cells 10 is changed abnormally, the battery cell may be regarded as subject to performance degradation. For example, if certain battery cells 10 among the plurality of battery cells 10 have a voltage, current or capacity excessively lower than that of other battery cells 10, or excessively increased resistance as compared to others, the certain battery cells 10 may be regarded as subject to performance degradation.

Meanwhile, the performance measurement section 100 may measure the voltage, current, resistance or capacity of the battery cells 10 in various manners. For example, the performance measurement section 100 may measure the voltage of the battery cells 10 by providing a voltmeter in parallel on both ends of the battery cells 10. Also, the performance measurement section 100 may measure the current of the battery cells 10 by connecting an amperemeter with the battery cells 10 in series. Besides, the methods mentioned, the present invention may use various performance measurement methods for battery cells 10 known in the art.

As mentioned above, in the present invention, the performance of the battery cells 10 preferably means a voltage, current, resistance, capacity or a combination thereof for the battery cells 10. However, the present invention is not limited thereto. That is, the performance of the battery cells 10 may also be determined by factors other than voltage, current, resistance and capacity.

For example, the performance of the battery cells 10 may be determined based on temperature, swelling or gas generation. If a certain battery cell 10 has an excessively increased temperature or is subject to swelling or gas generation, the certain battery cell 10 may be regarded as subject to performance degradation. In this case, the performance measurement section 100 may measure a temperature, swelling or gas generation of the battery cells 10.

The cell switching section 200 turns on or off the connection of each battery cell 10 to other battery cells 10. As shown in FIG. 2, when the battery cells 10 are connected in series in the battery system, the cell switching section 200 may be positioned between each of the battery cells 10 and other battery cell 10 to selectively turn on or off the connection between each battery cell 10.

Figure 3:
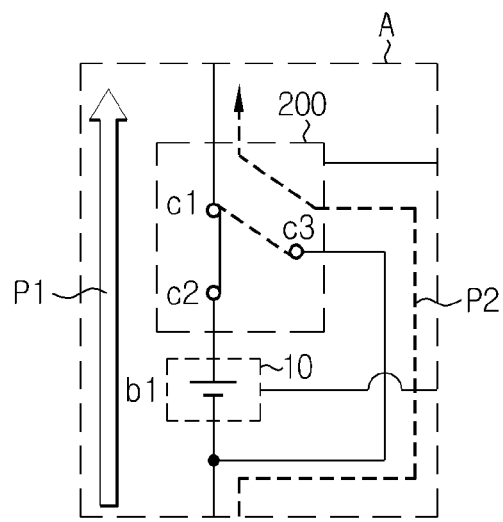
FIG. 3 shows Part A of FIG. 2 in which the cell switching section of a battery system managing apparatus according to one embodiment of the present invention is in the form of 3-contacts switch.

Preferably, the cell switching section 200 may be in the form of 3-contacts switch. FIG. 3 shows Part A of FIG. 2 in which the cell switching section 200 of a battery system managing apparatus according to one embodiment of the present invention is in the form of a 3-contacts switch.

Referring to FIG. 3, the cell switching section 200 of a battery system managing apparatus may be in the form of a 3-contacts switch having 3 contact points of c1, c2 and c3. If contact points 1 and 2 are connected in the cell switching section 200, a current path is formed to pass battery cell b1, as depicted by arrow p1, such that battery cell b1 may be connected to other battery cells 10 adjacent thereto. Whereas, if contact points 1 and 3 are connected in the cell switching section 200, a current path does not pass battery cell b1, as depicted by arrow p2. Accordingly, in this case, the connection of the battery cell b1 to other battery cells 10 is turned off, that is interrupted. Thus, if the cell switching section 200 is in the form of a 3-contacts switch, the connection of the battery cell 10 to other battery cells may be selectively controlled by manipulating a single switch just once.

Meanwhile, although the embodiment of FIG. 3 represents the cell switching section 200 consisting of 3-contacts switch, the present invention is not limited to such a specific form of the cell switching section 200. For example, the cell switching section 200 may be in the form of a 2-contacts switch.

Figure 4:
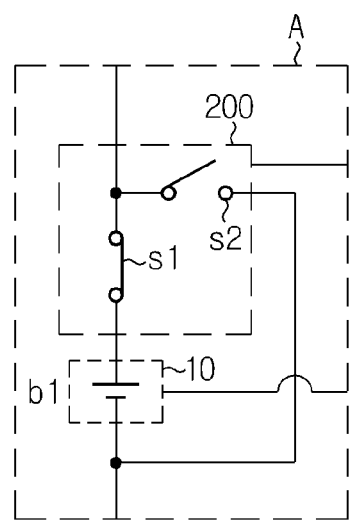
FIG. 4 shows Part A of FIG. 2 in which the cell switching section of a battery system managing apparatus according to one embodiment of the present invention is in the form of 2-contacts switch.

FIG. 4 shows Part A of FIG. 2 in which the cell switching section of a battery system managing apparatus according to one embodiment of the present invention is in the form of 2-contacts switch.

Referring to FIG. 4, the cell switching section 200 of the battery system managing apparatus may be in the form of two 2-contacts switch of s1 and s2. As shown in the drawing, if s1 is turned on and s2 is turned off, a current path may be formed to pass battery cell b1 such that battery cell b1 may be connected to other battery cells. However, if s1 is turned off and s2 is turned on, a current path does not pass battery cell b1 such that battery cell b1 may be interrupted to connect to other battery cells 10.

Meanwhile, the embodiment of FIG. 2 represents only four battery cells b1 to b4 and four cell switching sections corresponding thereto, but the number of the battery cells 10 may be increased or decreased as mentioned above, and the number of the cell switching section 200 may be more or less than 4. That is, the present invention is not limited to a specific number of unit cell switching section 200 consisting of the cell switching section 200.

The controlling section 300 receives information on the performance of each of the battery cells 10 measured by the performance measurement section 100 and compares measured performance of each battery cell 10 with a reference performance. At this time, the reference performance used to compare measured performance of each battery cell 10 may be stored in a memory embedded in the controlling section 300 or other storage device provided in the outside thereof. Such a reference performance may be stored as a certain value or range.

Thus, the controlling section 300 compares each performance measured for each battery cell 10 with a reference performance to determine whether there are the battery cell(s) 10 having measured performance lower than the reference performance. If the battery cells 10 having measured performance lower than the reference performance is present, the controlling section 300 controls the cell switching section 200 to interrupt the connection of the relevant battery cell(s) 10 to other battery cells 10. A configuration of the cell switching section 200 controlled by the controlling section 300 will be specifically explained with reference to FIGS. 5 and 6.

Figure 5:
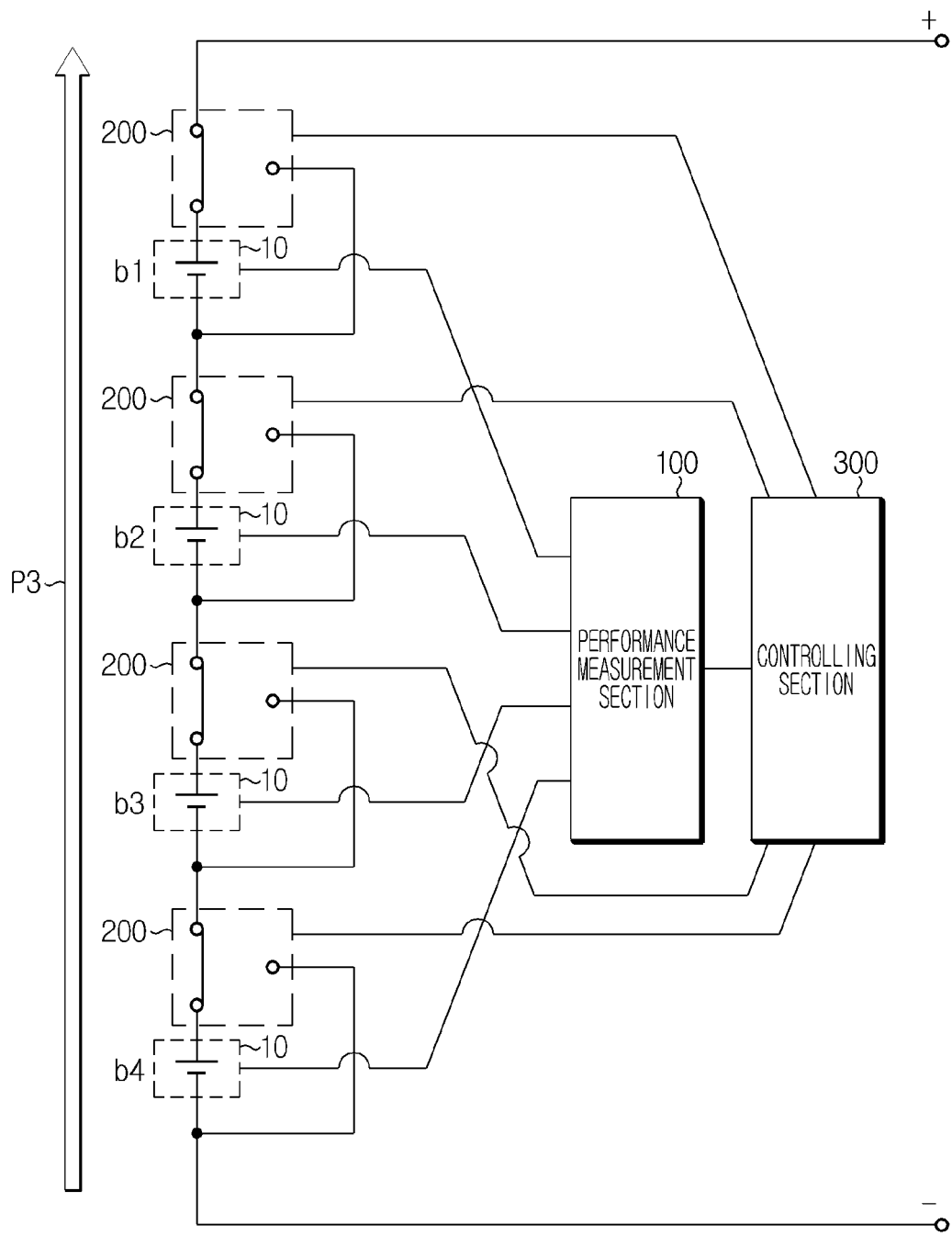
FIGS. 5 and 6 are views showing different embodiments in which the cell switching section of a battery system according to one embodiment of the present invention is controlled by a controlling section, respectively.
Figure 6:
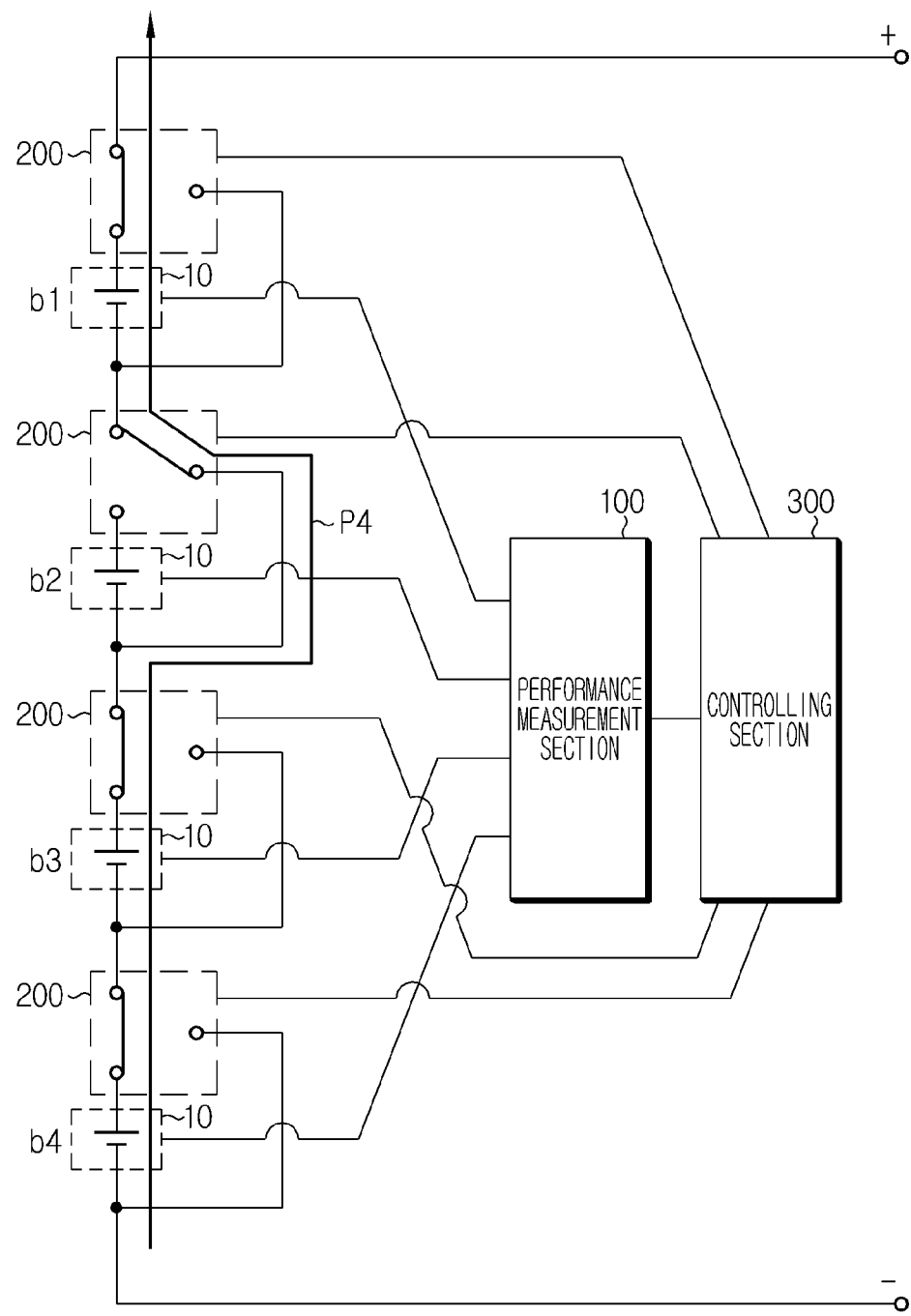

FIGS. 5 and 6 are views showing different embodiments in which the cell switching section 200 of a battery system according to one embodiment of the present invention is controlled by a controlling section 300, respectively.

In the battery systems shown in FIGS. 5 and 6, four battery cells b1, b2, b3 and b4 are connected in series, and four cell switching sections 200 consisting of a 3-contacts switch selectively open and shut the connection of each battery cell 10.

The controlling section 300 receives information on the performance of each of the battery cells 10 measured by the performance measurement section 100 and compares the information with a pre-stored reference performance. For example, assuming that the performance measurement section 100 measures a voltage of each battery cell 10 as a performance thereof and a reference voltage is in the range of 2.5 to 3.5 V, the controlling section 300 determines whether the measured voltage of each battery cell 10, obtained in the performance measurement section 100, is within a range of 2.5 to 3.5 V.

In this case, if the measured voltages of battery cells b1 to b4 are within 2.5 to 3.5 V, the controlling section 300 controls the cell switching part 200, as shown in FIG. 5, to connect the battery cells b1 to b4 with each other. At this time, overall current path is formed to pass battery cells b1 to b4, as depicted by arrow p3 in FIG. 5.

Whereas, if the voltages measured for battery cells b1, b3 and b4 are within 2.5 to 3.5 V but the voltage measured for battery cells b2 is lower than 2.5 V or higher than 3.5 V, the controlling section 300 may control the cell switching part 200, as shown in FIG. 6. At this time, the connection of the battery cell b2 to the battery cells b1 and b3 adjacent thereto is interrupted and an overall current path is formed to by-pass battery cell b2, as depicted by arrow p4 in FIG. 6.

Meanwhile, although the embodiments of FIGS. 5 and 6 explain that the performance measurement section 100 measures a voltage of each battery cell 10 as a performance thereof and the controlling section 300 compares the voltage measured for each battery cell 10 with a reference voltage, such an explanation may be also applied in other factors, as well as the voltage, to compare and determine the performance of the battery cells 10. For example, if the resistance measured for battery cell b2 is higher than a reference resistance or the capacity measured for battery cell b2 is lower than a reference capacity, the cell switching section 200 may be controlled, as shown in FIG. 6, to form a current path such as p4.

Similarly to the embodiment of FIG. 2, the embodiments of FIGS. 5 and 6 explain based on four battery cells b1 to b4 for the sake of convenience only and can be applied to cases in which there are even more battery cells. Preferably, the present invention is beneficial when used in a battery system having even more battery cells. In a circumstance that the number of battery cells 10 included in a battery system is small, if the connection of some battery cells is interrupted, the performance of the battery system may be greatly degraded as compared with an original performance thereof, thereby hindering the original function of the battery system. Therefore, the present invention is preferably used in a battery system in which the number of battery cells 10 is sufficient enough so that although the connection of some of the battery cells 10 is interrupted, the remaining battery cells 10 conduct the original performance of the battery system. Particularly, a battery system used in a smart grid system or micro grid system undergoes a voltage drop of only less than 1% as compared to a normal voltage even though the connection of some battery cells 10 is interrupted. Accordingly, the present invention is preferably applied in such systems.

The apparatus for managing a battery system according to the present invention may further include a system switching section 400, as shown in FIGS. 1 and 2.

The system switching section 400 is disposed in the charging/discharging path of the battery system to turn on or off a current flow path for the whole plurality of battery cells 10 included in the battery system. Such a switching of a system switching section 400 may be controlled by the controlling section 300.

Particularly, it is better for the controlling section 300 to turn off the system switching section 400 when turning on or off the cell switching section 200. That is, before turning on or off the cell switching section 200, the controlling section 300 may first turn off the system switching section 400 so as to interrupt overall current of the battery system. When the cell switching section 200 is turned on or off, an arc may be generated in the contact points of the cell switching section 200. Such an arc generation may be prevented by interrupting the overall current flowing into the system switching section 400 before the switching of the cell switching section 200. In addition, in order to prevent or minimize the arc generation in the cell switching section 200, an arc extinguishing structure may be provided in the inside and outside of the cell switching section 200.

Preferably, in spite of the presence of the battery cell(s) 10 having measured performance lower than a reference performance, when the number of the battery cell(s) 10 being pre-interrupted to connect to other battery cells 10 exceeds a certain number, the controlling section 300 may not interrupt the connection of other battery cells 10 to the relevant battery cell(s) 10. For example, assume that if the battery system includes one hundred battery cells 10 and six or more of the battery cells 10 are interrupted, the battery system cannot conduct the function thereof. In this circumstance, if 5 or more of the battery cells 10 interrupted to connect due to performance degradation are already present, although further finding a performance degradation in other battery cells 10, the controlling section 300 may not interrupt the connection of the relevant battery cells 10, i.e., the battery cells 10 newly determined to have a performance degradation. This is because the battery system cannot operate normally if the connection of the battery cells 10 is interrupted over an allowed range.

Meanwhile, an allowed range for the number of the battery cell(s) 10 for connection to be interrupted may vary depending on a scale, type or the like of the battery system, similar to the overall numbers of the battery cells 10 included in the battery system. The allowed range may be stored in a memory embedded in the controlling section 300 or other storage device provided in the outside thereof.

Also, when the number of the battery cell(s) 10 interrupted to connect to other battery cells 10 exceeds a certain number, the controlling section 300 may provide a warning information to a user. For example, similar to the above embodiment, assume that the battery system cannot conduct the function thereof if six or more of the battery cells 10 are interrupted in the battery system. At this time, when 5 or more of the battery cells 10 is interrupted to connect to other battery cells, the controlling section 300 may provide a warning information on such a circumstance to a user. Accordingly, a user may determine a repair or exchange of the battery cells 10 included in the battery system on the basis of the warning information.

Furthermore, such a provision of warning information may also be done in the state that the battery cells 10 are not yet interrupted, as the result that their performance degradation simply exceeds an allowed range for interruption. For example, similar to the above embodiment, in the condition that only five battery cells 10 among one hundred battery cells 10 are allowed for interruption, the controlling section 300 may not interrupt connection for the sixth battery cell 10 or more which have a measured performance lower than a reference performance, while providing relevant warning information to a user.

Meanwhile, the controlling section 300 may provide warning information to a user by various methods. For example, a warning lamp or sound, or display devices such as monitors exhibiting relevant information may be used for providing the warning information.

Also, when the battery cell(s) 10 interrupted to connect to other battery cells 10 is present, the controlling section 300 may provide a user with at least one of the location, performance and number information of the battery cell(s) 10 interrupted. For example, the controlling section 300 may provide a user with information about the location where the interrupted battery cell(s) 10 is present in a whole battery system, what kind of performance is degraded in the battery cells 10 to cause interruption, or how many battery cells 10 is interrupted to connect. Accordingly, a user may determine a repair or exchange of the battery cell(s) 10 on the basis of the information provided and may take action suitable to the repair or exchange.

Here, the apparatus for managing a battery system according to the present invention may further include a memory section 500, as shown in FIG. 2. The memory section 500 may store at least one of the location, performance and number information of the battery cell(s) 10 which are interrupted to connect due to their performance degradation. Thus, if the memory section 500 stores at least one of location, performance and number information and the like for the battery cells interrupted, a user may, at any time, check the status of the battery system or determine a repair or exchange of the battery cells 10 with reference to the information stored in the memory section 500.

At this time, the storage of the location, performance and number information of the battery cells 10 into the memory section 500 may be conducted by the controlling section 300. The controlling section 300 may update the relevant information stored in the memory section 500 whenever the battery cells 10 interrupted to connect are added or reduced.

Meanwhile, in FIGS. 2, 5 and 6, the lines between each component of the battery system only represent that each component is connected with each other to exchange various information, so the numbers of the lines depicted in drawings do not intend to have specific meanings. For example, in the drawings, the connection between the performance measurement section 100 and the battery cells 10 are depicted by only one line per battery cell 10, but it is possible to depict by two or more lines.

Figure 7:
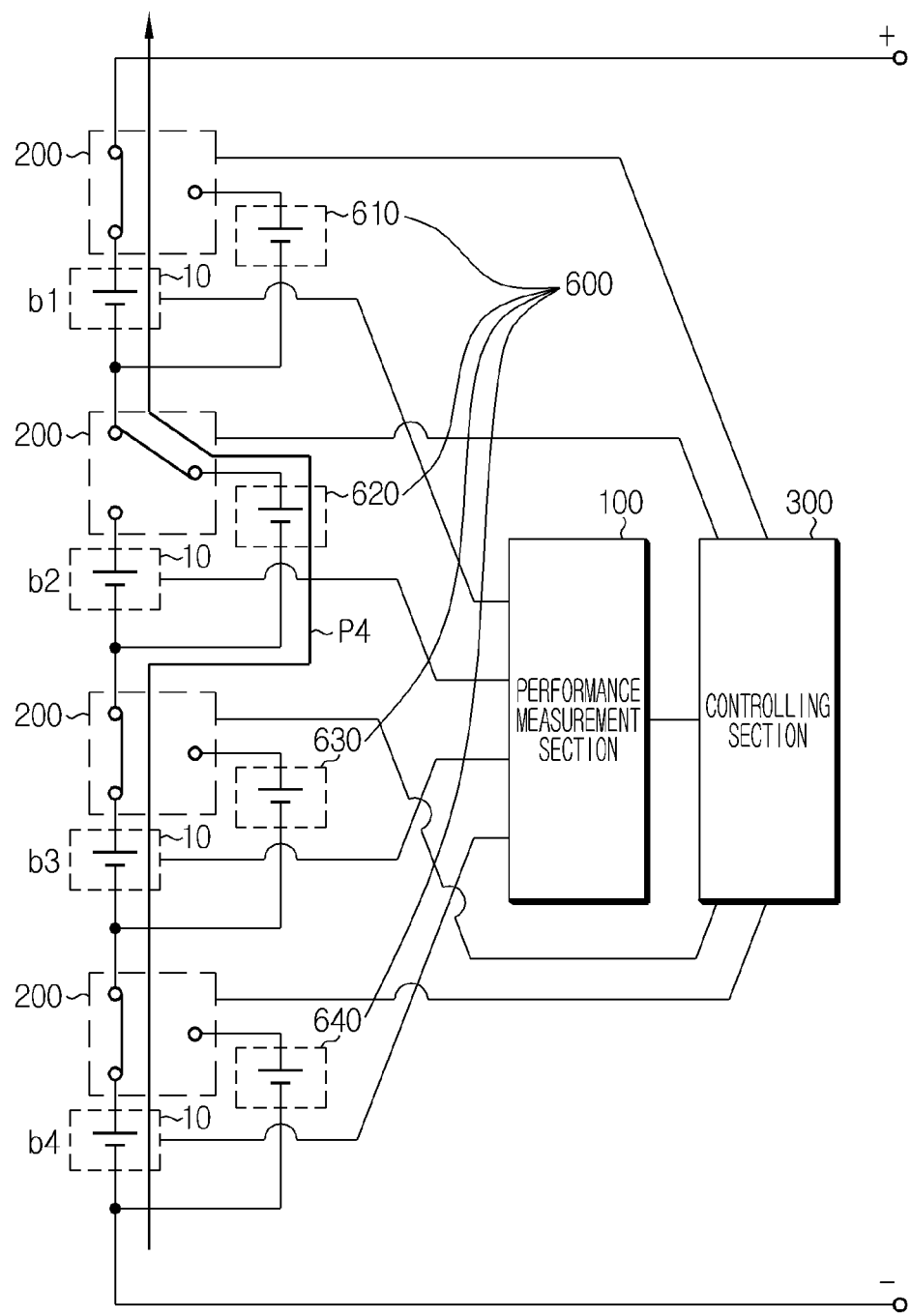
FIG. 7 schematically shows a configuration of an apparatus for managing a battery system according to other embodiment of the present invention.

FIG. 7 schematically shows a configuration of an apparatus for managing a battery system according to other embodiment of the present invention.

As shown in FIG. 7, the battery system managing apparatus according to the present invention may further include an auxiliary battery 600. In the presence of the battery cell(s) 10 interrupted to connect to other battery cells 10, the auxiliary battery 600 is additionally connected in series with other battery cells 10, instead of the battery cells 10 interrupted. For this, the auxiliary battery 600 may be connected between one end of each battery cell 10 and the cell switching section 200. That is, the auxiliary battery 600 may be installed on a path by-passing each battery cell 10.

The embodiment of FIG. 7 represents a configuration that the cell switching section 200 is controlled such that a current path by-passes b2. At this time, the current path by-passing b2 is provided with an auxiliary battery 620 to replace b2. Accordingly, although b2 is interrupted to connect to other battery cells, i.e., b1, b3 and b4, the auxiliary battery 620, instead of b2, is additionally connected to b1, b3 and b4 in series.

In accordance with such an embodiment, although some battery cells 10 are by-passed due to a problem of performance, the auxiliary battery 600 is additionally connected instead of the battery cells 10 by-passed, so the battery system may not greatly change in terms of its performance.

Figure 8:
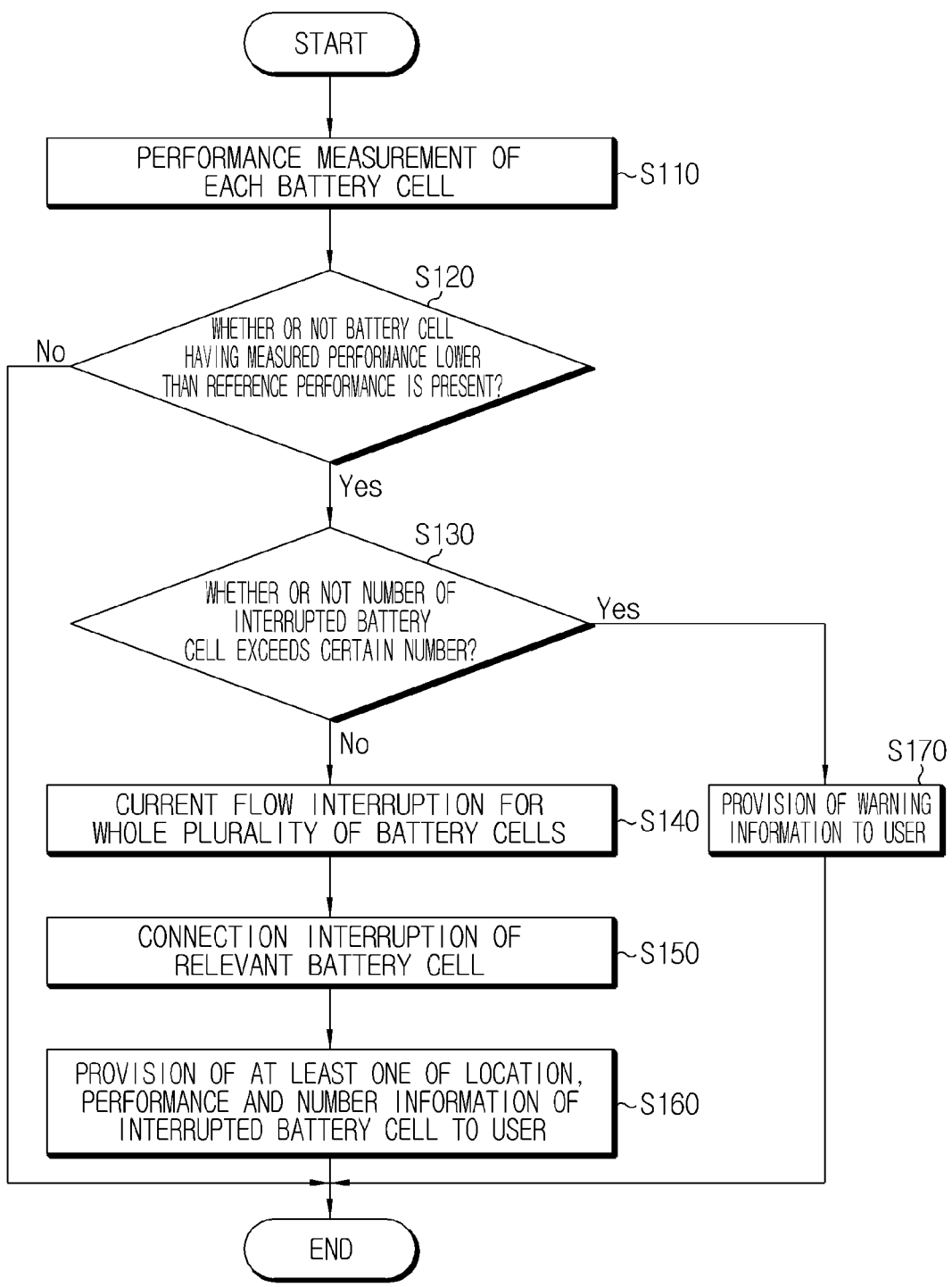
FIG. 8 is a flow chart schematically illustrating a method for managing a battery system according to one embodiment of the present invention.

FIG. 8 is a flow chart schematically illustrating a method for managing a battery system according to one embodiment of the present invention. Each step of FIG. 8 is conducted by the battery system managing apparatus according to the present invention.

Referring to FIG. 8, first, each battery cell 10 included in the battery system, which is connected in series, is measured for its performance (S110). Here, the performance of the battery cells may be at least one of the voltage, current, resistance and capacity thereof. Next, the measured performance of each battery cell 10 is compared with a reference performance, and the battery cells 10 are determined whether the measured performances thereof are lower than the reference performance (S120). When the battery cell(s) 10 having measured performance lower than the reference performance is present, the relevant battery cell(s) 10 are interrupted to connect to other battery cells 10 (S150). At this time, step S150 may be conducted by the switching of a 3-contacts switch.

Preferably, as shown in drawings, before step S150, a current flow may be further interrupted for the whole plurality of battery cells 10 (S140).

Also, as shown in the drawings, although the battery cell(s) 10 having measured performance, measured in step S120, lower than the reference performance is present, before step S150, the battery system managing method according to the present invention may further include the step of determining whether the number of the battery cell(s) 10 interrupted to connect to other battery cells 10 exceeds a certain number (S130). Here, when the number of the battery cell(s) 10 interrupted to connect to other battery cells 10 already exceeds a certain number, in order to prevent an additional connection interruption for even more battery cells 10, for the battery cells 10 having measured performance, measured in step S120, lower than the reference performance, the connection interruption to other battery cells may not be conducted.

Also, shown in the drawings, when the number of the battery cell(s) 10 interrupted to connect to other battery cells 10 exceeds a certain number, a warning information may be further provided to a user (S170).

Besides, when the connection of the battery cells 10 is interrupted in step S150, the battery system managing method according to the present invention may further include the step of providing a user with at least one of the location, performance and number information of the battery cell(s) 10 interrupted (S160). At this time, step S160 may be conducted by storing at least one of the location, performance and number information for the battery cell(s) 10 interrupted in step S150 in the memory section 500 and providing a user with the information stored.

Meanwhile, in embodiments disclosed above, the battery system managing apparatus according to the present invention is explained based on a configuration that a unit of the battery cells 10 is subject to a performance measurement, connection interruption and the like, but the present invention is not limited to such an embodiment. That is, the battery system managing apparatus according to the present invention may conduct a performance measurement, connection interruption and the like in a unit of battery cells.

Figure 9:
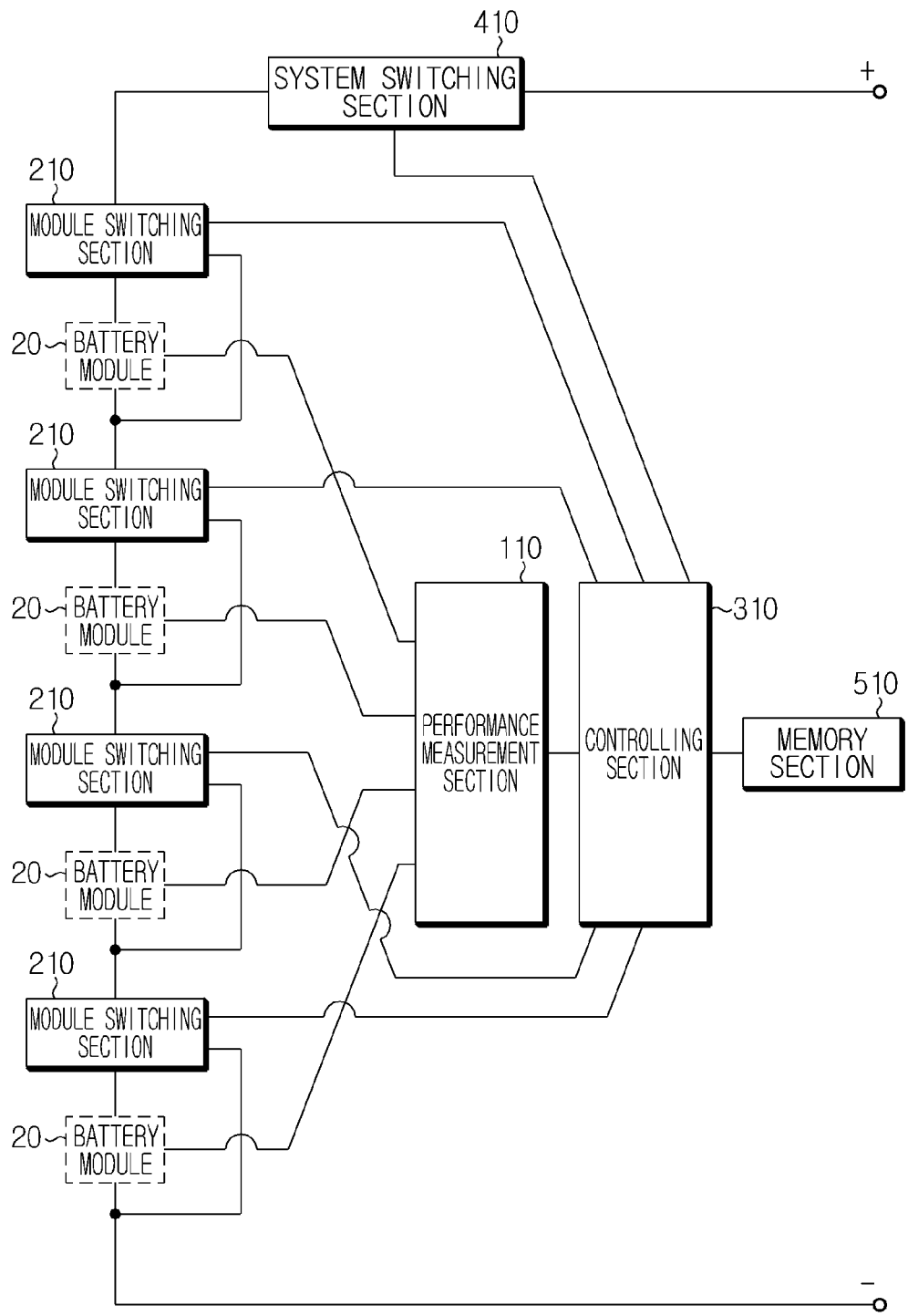
FIG. 9 schematically shows a configuration of an apparatus for managing a battery system according to another embodiment of the present invention.

FIG. 9 schematically shows a configuration of an apparatus for managing a battery system according to another embodiment of the present invention. Referring to FIG. 9, the apparatus for managing a battery system according to the present invention includes a performance measurement section 110, a cell switching section 210 and a controlling section 310. The configuration of FIG. 9 is similar to that of FIG. 2 except that a performance measurement, connection interruption, etc., is conducted in a unit of battery cells 20, not the battery cells 10. Accordingly, the following explanation will be based on a configuration different from FIG. 2 and parts to which the explanation on the embodiment of FIG. 2 is applicable will not be described in detail here.

The performance measurement section 110 determines the performance of each of the battery cells 20 connected in series included in the battery system. Here, the battery cells 20 include multiple battery cells connected in series and/or parallel. The performance measurement section 110 may measure the performance of each battery cell 20 which is an assembly of multiple battery cells. At this time, the performance measurement section 110 may measure the performance of each of the battery cells included in the battery cell 20 as a performance for the battery cell 20.

Preferably, the performance measurement section 110 may measure a voltage, current, resistance or capacity for each battery cell 20. Also, the performance measurement section 110 may measure at least two of the above.

The cell switching section 210 turns on or off the connection of other battery cells 20 to each battery cell 20. Here, the cell switching section 210 may be in the form of a 3-contacts switch.

The controlling section 310 receives information on the performance of each battery cell 20 measured by the performance measurement section 110 and compares the received performance of each battery cell 20 with a reference performance. Then, the controlling section 310 determines whether the measured performance for each battery cell 20 is lower than the reference performance. If the battery cell(s) 20 having measured performance lower than the reference performance is present, the controlling section 310 controls the cell switching section 200 to interrupt connection to other battery cells 20 to the relevant battery cell(s) 20. That is, in the configuration of multiple battery cells connected in series, the controlling section 310 may make a current path by-pass the battery cell(s) 20 having measured performance lower than the reference performance.

The apparatus for managing a battery system according to the present invention may further include a system switching section 410 for turning on or off a current flow path for the whole plurality of battery cell 20. In this case, the controlling section 310 may turn off the system switching section 400 before turning on or off the cell switching section 210.

Preferably, although the battery cell(s) 20 having measured performance lower than a reference performance is present, when the number of the battery cell(s) 20 being pre-interrupted to connect to other battery cells 20 exceeds a certain number, the controlling section 310 may not interrupt the connection of the relevant battery cell(s) 20 to other battery cells 20. At this time, the number of the battery cell(s) 20 which may be interrupted to connect may vary depending on the overall number of the battery cells 20 included in the battery system, a scale, type or the like of the battery system.

Also, when the number of the battery cell(s) 20 being interrupted to connect to other battery cells 20 exceeds a certain number, the controlling section 310 may provide warning information to a user. At this time, such a provision of a warning information may also be done in the state that the battery cells 20 are not yet interrupted, as the result that their performance degradation simply exceeds an allowed range for interruption.

Also, when there are battery cell(s) 20 interrupted to connect to other battery cells 20, the controlling section 310 may provide a user with at least one of the location, performance and number information of the battery cell(s) 20 interrupted.

At this time, the apparatus for managing a battery system according to the present invention may further include a memory section 510 for storing at least one of the location, performance and number information of the battery cell(s) 20 interrupted.

Preferably, in the presence of the battery cell(s) 20 interrupted to connect to other battery cells 20, the apparatus for managing a battery system according to the present invention may further include an auxiliary battery 600, instead of the battery cell(s) 20 interrupted, which is additionally connected to other battery cells 20 in series.

INDUSTRIAL APPLICABILITY

While the present invention has been described with respect to the specific embodiments and drawings, it should be recognized that various modifications and changes may be made by those skilled in the art to the invention which also fall within the scope of the invention as defined in the appended claims.

Meanwhile, the term 'section' used herein just represents a logic unit, which may not be a component that can be physically separated, which is apparent to those of ordinary skill in the art.

What is claimed is:

1. An apparatus for managing a battery system having a plurality of battery cells including first and second battery cells connected in series, the apparatus comprising:
    a performance measurement section for measuring at least one of voltage, current, resistance and capacity of each of the battery cells as a performance of each of the battery cells, respectively;
    a system switching section for turning on or off a current flow path for the whole of the plurality of battery cells;
    a first cell switching section having a positive terminal directly connected to a negative terminal of the system switching section and having a negative terminal directly connected to a positive terminal of the first battery cell, the first cell switching section for turning on or off a connection between the first battery cell and other battery cells;
    a second cell switching section having a positive terminal directly connected to a negative terminal of the first battery cell and having a negative terminal directly connected to a positive terminal of the second battery cell, the second cell switching section for turning on or off a connection between the second battery cell and other battery cells;
    a controlling section for comparing the performance of each of the battery cells measured by the performance measurement section with a reference performance and, in the presence of the each of the battery cells having a measured performance lower than the reference performance, controlling at least one of the first and second cell switching sections to interrupt the connection, to other battery cells, of each of the first and second battery cells, respectively, having the measured performance lower than the reference performance, and turning off the system switching section before controlling either of the first and second cell switching sections; and an auxiliary battery configured to, in the presence of the interruption of the connection, to other battery cells, of each of the battery cells having the measured performance lower than the reference performance, additionally connect to other battery cells in series, instead of each of the battery cells interrupted.

2. The apparatus for managing a battery system according to claim 1, wherein each of the first and second cell switching sections is in the form of a 3-contacts switch.

3. The apparatus for managing a battery system according to claim 1, wherein although each of the battery cells having the measured performance lower than the reference performance is present, in the case that a number of the battery cells being pre-interrupted to connect to other battery cells exceeds a certain number, the controlling section does not interrupt the connection, to other relevant battery cells, of each of the battery cells having the measured performance lower than the reference performance.

4. The apparatus for managing a battery system according to claim 1, wherein in the case that a number of the battery cells being interrupted to connect to other battery cells exceeds a certain number, the controlling section provides a warning information to a user.

5. The apparatus for managing a battery system according to claim 1, wherein in the presence of the interruption of the connection, to other battery cells, of each of the battery cells having the measured performance lower than the reference performance, the controlling section provides a user with at least one of the location, performance and number information of each of the battery cells interrupted.

6. The apparatus for managing a battery system according to claim 5, further comprising a memory section for storing at least one of the location, performance and number information of each of the battery cells interrupted.

7. A method for managing a battery system having a plurality of battery cells including first and second battery cells connected in series, and a system switching section for turning on or off a current flow path for the whole of the plurality of battery cells, the method comprising:

measuring, by a performance measurement section, at least one of voltage, current, resistance and capacity of each of the battery cells as a performance of each of the battery cells, respectively;

turning on or off, by a first cell switching section, a connection between the first battery cell and other battery cells, the first cell switching section having a positive terminal directly connected to a negative terminal of the system switching section and having a negative terminal directly connected to a positive terminal of the first battery cell, turning on or off, by a second cell switching section, a connection between the second battery cell and other battery cells, the second cell switching section having a positive terminal directly connected to a negative terminal of the first battery cell and having a negative terminal directly connected to a positive terminal of the second battery cell;

comparing, by a controlling section, the performance of each of the battery cells measured by the performance measurement section with a reference performance;

in the presence of each of the battery cells having a measured performance lower than the reference performance, controlling, by the controlling section, at least one of the first and second cell switching sections to interrupt the connection, to other battery cells, of each of the first and second battery cells, respectively, having the measured performance lower than the reference performance;

turning off, by the controlling section, the system switching section before controlling either of the first and second cell switching sections; and additionally connecting, in the presence of the interruption of the connection, to other battery cells, of each of the battery cells having the measured performance lower than the reference performance, an auxiliary battery to other battery cells in series, instead of each of the battery cells interrupted.

* * * * *